(12) United States Patent
Choi et al.

(10) Patent No.: US 10,361,263 B2
(45) Date of Patent: Jul. 23, 2019

(54) DISPLAY APPARATUS AND METHOD OF MANUFACTURING THE SAME

(71) Applicant: Samsung Display Co., Ltd., Yongin-Si, Gyeonggi-Do (KR)

(72) Inventors: Jaihyuk Choi, Hwaseong-si (KR); Sukwon Jung, Sejong-si (KR); Myungsoo Huh, Suwon-si (KR); Seok-jin Ko, Seoul (KR); Hyunwoo Joo, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/949,614

(22) Filed: Apr. 10, 2018

(65) Prior Publication Data
US 2019/0081121 A1    Mar. 14, 2019

(30) Foreign Application Priority Data
Sep. 12, 2017    (KR) .................. 10-2017-0116795

(51) Int. Cl.
*H01L 27/32* (2006.01)
*H01L 27/12* (2006.01)
*H01L 29/786* (2006.01)

(52) U.S. Cl.
CPC ...... *H01L 27/3262* (2013.01); *H01L 27/1229* (2013.01); *H01L 27/1274* (2013.01); *H01L 29/78675* (2013.01); *H01L 29/78684* (2013.01); *H01L 29/78696* (2013.01); *H01L 2227/323* (2013.01)

(58) Field of Classification Search
CPC ............ H01L 27/3262; H01L 27/1229; H01L 27/1274
See application file for complete search history.

(56) References Cited

U.S. PATENT DOCUMENTS

| 8,030,146 | B2 | 10/2011 | Lin et al. |
| 9,129,927 | B2 | 9/2015 | Gupta et al. |
| 2014/0175423 | A1 | 6/2014 | Jeong et al. |
| 2016/0307979 | A1 | 10/2016 | Lee |
| 2016/0307988 | A1 | 10/2016 | Kim et al. |

FOREIGN PATENT DOCUMENTS

| KR | 10-2014-0081412 A | 7/2014 |
| KR | 10-2016-0122893 A | 10/2016 |

OTHER PUBLICATIONS

Virginia Seminiconductor, "The General Properties of Si, Ge, SiGe, SiO2 and Si3N4", Jun. 2002; 5 pages.

*Primary Examiner* — Douglas M Menz
(74) *Attorney, Agent, or Firm* — Innovation Counsel LLP (57) ABSTRACT

Provided is a display apparatus. The display apparatus includes a base substrate, a first transistor disposed on the base substrate and including a first semiconductor layer including a first layer and a second layer disposed to come into contact with a first layer and including a compound made of at least two materials of a Group IV elements, a first control electrode overlapping the first semiconductor layer, a first input electrode connected to the first semiconductor layer, and a first output electrode connected to the first semiconductor layer, a second transistor and an organic light emitting diode.

10 Claims, 10 Drawing Sheets

DISPLAY APPARATUS AND METHOD OF MANUFACTURING THE SAME

CROSS-REFERENCE TO RELATED APPLICATIONS

This U.S. non-provisional patent application claims priority under 35 U.S.C. § 119 of Korean Patent Application No. 10-2017-0116795, filed on Sep. 12, 2017, the entire contents of which are hereby incorporated by reference.

BACKGROUND

The present disclosure herein relates to a display apparatus and a method for manufacturing the same, and more particularly, to a display apparatus including a transistor having a multilayered structure, which is improved in performance, and a method for manufacturing the same.

A display apparatus includes a plurality of pixels and driving circuits (e.g., a scan driving circuit and a data driving circuit) controlling the plurality of pixels. Each of the plurality of pixels includes a display device and a pixel driving circuit controlling the display device. The pixel driving circuit may include a plurality of transistors connected to each other.

A semiconductor layer of each of the transistors may be used as a channel layer. In general, a polycrystalline silicon layer may be applied to high field effect mobility and a high-speed operation circuit and be widely used as the semiconductor layer for the transistor. The thin film transistor using the polycrystalline silicon layer may be mainly used for an active device of an active matrix liquid crystal display device (AM-LC) and a switching device and a driving device of an organic light emitting device (OLED).

In an upper switching transistor of the existing multilayered structure, IGZO, ITZO, and the like, which are oxide materials, have been used as the channel layer. This is done because, when an annealing process is performed on a channel layer of a lower driving transistor, the channel layer of the upper switching transistor is damaged due to diffused reflection or thermal problems.

The channel layer of the switching transistor may be formed by depositing IGZO and ITZO, which are oxide materials, through a sputtering process. When the deposition is performed through the sputtering process, particles may be generated. Also, since there is a technical limitation in achieving uniform crystallization of a large area, it is pointed out that there is a limitation in terms of productivity such as yield.

SUMMARY

The present disclosure provides a display apparatus including a transistor having a multilayered structure, in which a seed layer and a compound crystallization layer made of at least two materials of Group IV elements are used as channel layers of a switching transistor to improve performance, and a method for manufacturing the same.

An embodiment of the inventive concept provides a display apparatus including: a base substrate; a first transistor disposed on the base substrate and including a first semiconductor layer including a first layer and a second layer disposed to come into contact with a first layer and including a compound made of at least two materials of a Group IV elements, a first control electrode overlapping the first semiconductor layer, a first input electrode connected to the first semiconductor layer, and a first output electrode connected to the first semiconductor layer; a second transistor disposed on the base substrate and including a second semiconductor layer spaced apart from the first semiconductor layer, a second control electrode overlapping the second semiconductor layer, a second input electrode connected to the second semiconductor layer, and a second output electrode connected to the second semiconductor layer; and an organic light emitting diode including a first electrode electrically connectied the first transistor and the second transistor, a second electrode disposed on the first electrode, and an emission layer disposed between the first electrode and the second electrode.

In an embodiment, the first layer may have a predetermined crystal, and at least a portion of the second layer may have the same crystal as the first layer.

In an embodiment, the compound may include at least two materials of Si, Ge, and C.

In an embodiment, the second semiconductor layer may include polycrystalline silicon.

In an embodiment, the first semiconductor layer and the second semiconductor may be disposed on the same layer.

In an embodiment, the display apparatus may further include at least one insulation layer disposed between the first semiconductor layer and the second semiconductor layer, wherein the first semiconductor layer may be disposed on the insulation layer.

In an embodiment, the first electrode may be connected to the second output electrode.

In an embodiment of the inventive concept, a method for manufacturing a display apparatus includes: forming a first transistor including a first semiconductor layer, a first control electrode, a first input electrode, and a first output electrode on a base substrate; forming a second transistor including a second semiconductor layer, a second control electrode, a second input electrode, and a second output electrode on the base substrate; and forming an organic light emitting diode including a first electrode, an emission layer overlapping the first electrode, and a second electrode overlapping the emission layer, wherein the forming of the first transistor includes: forming a seed layer by depositing a gas comprising at least two materials of Group IV elements; forming a crystallization layer by depositing a same material as the seed layer on the seed layer; and patterning the seed layer and the crystallization layer to form the first semiconductor layer.

In an embodiment, in the forming of the crystallization layer, the same material as the seed layer may be grown with the same crystal as the seed layer to form the crystallization layer.

In an embodiment, the forming of the second semiconductor layer may include: depositing amorphous silicon; and annealing the amorphous silicon to form the second semiconductor layer.

In an embodiment, the forming of the seed layer may be performed after the annealing of the amorphous silicon.

In an embodiment, in the forming of the crystallization layer, the same material as the seed layer may be deposited through chemical vapor deposition.

In an embodiment, after the forming of the second transistor, the method may further include: forming the first input electrode; forming the first output electrode; and forming an organic light emitting diode connected to one of the second input electrode and the second output electrode and including at least one emission layer.

In an embodiment of the inventive concept, a display apparatus includes: a base substrate; a first transistor disposed on the base substrate and including a first semiconductor layer including a first layer and a second layer disposed to come into contact with a first layer and including a crystal made of at least two materials of a Group IV elements, a first control electrode overlapping the first semiconductor layer, a first input electrode connected to the first semiconductor layer, and a first output electrode connected to the first semiconductor layer; a second transistor disposed on the base substrate and including a second semiconductor layer spaced apart from the first semiconductor layer, a second control electrode overlapping the second semiconductor layer, a second input electrode connected to the second semiconductor layer, and a second output electrode connected to the second semiconductor layer; and an organic light emitting diode electrically connected to the first transistor and the second transistor and including a first electrode, a second electrode disposed on the first electrode, and an emission layer disposed between the first electrode and the second electrode.

In an embodiment, the first layer may have a predetermined crystal, and the crystal of the second layer is made of a compound.

In an embodiment, the second layer may include the crystal made of at least two materials of Si, Ge, and C of Group IV elements.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, embodiments of the inventive concept will be described with reference to the accompanying drawings. In this specification, it will also be understood that when one component (or region, layer, portion) is referred to as being 'on', 'connected to', or 'coupled to' another component, it can be directly connected/coupled on/to the one component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof. Hereinafter, a display apparatus according to an embodiment of the inventive concept will be described in detail with reference to the accompanying drawings.

Figure 1:
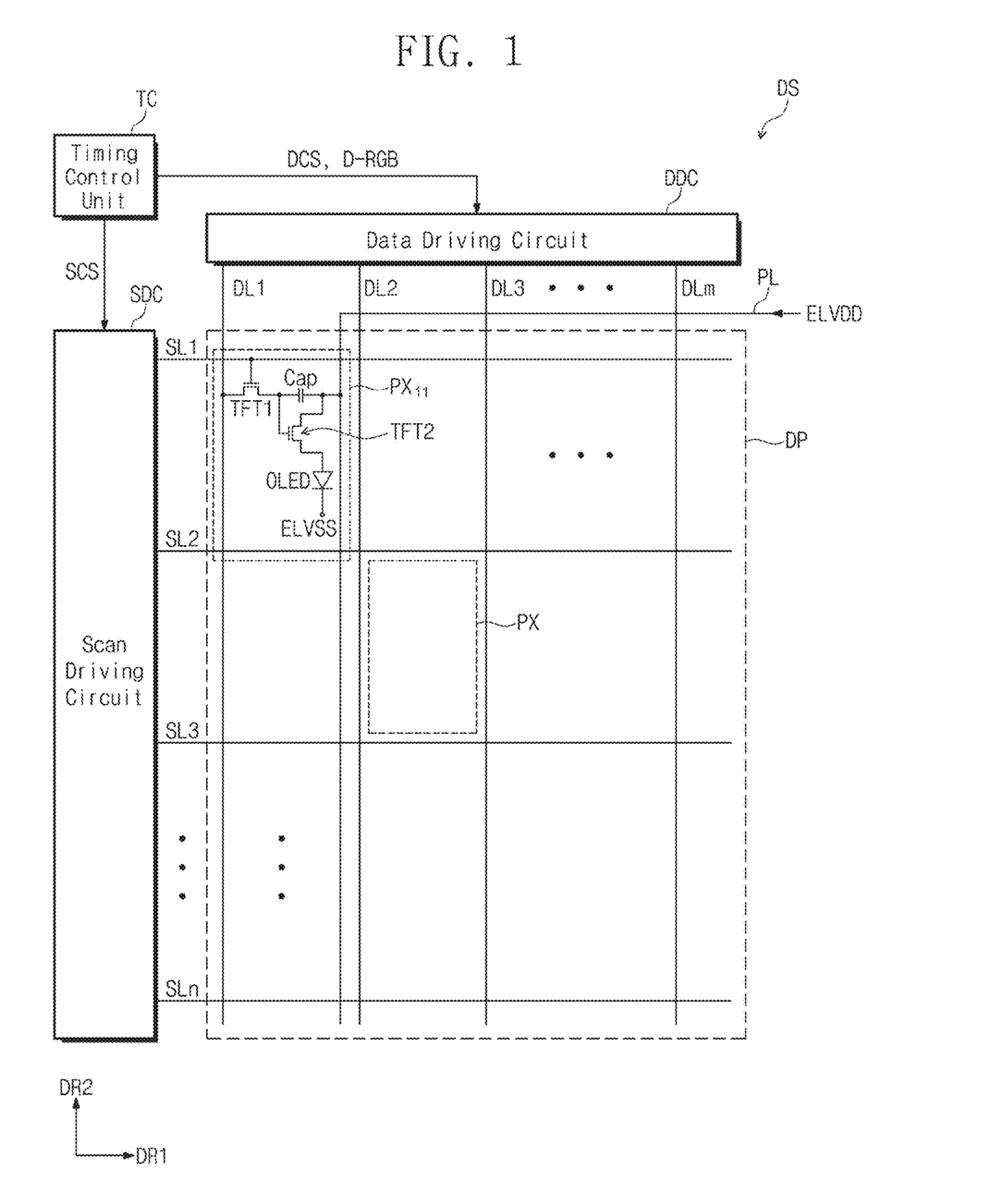
FIG. 1 is a block diagram of a display apparatus according to an embodiment of the inventive concept.
Figure 2:
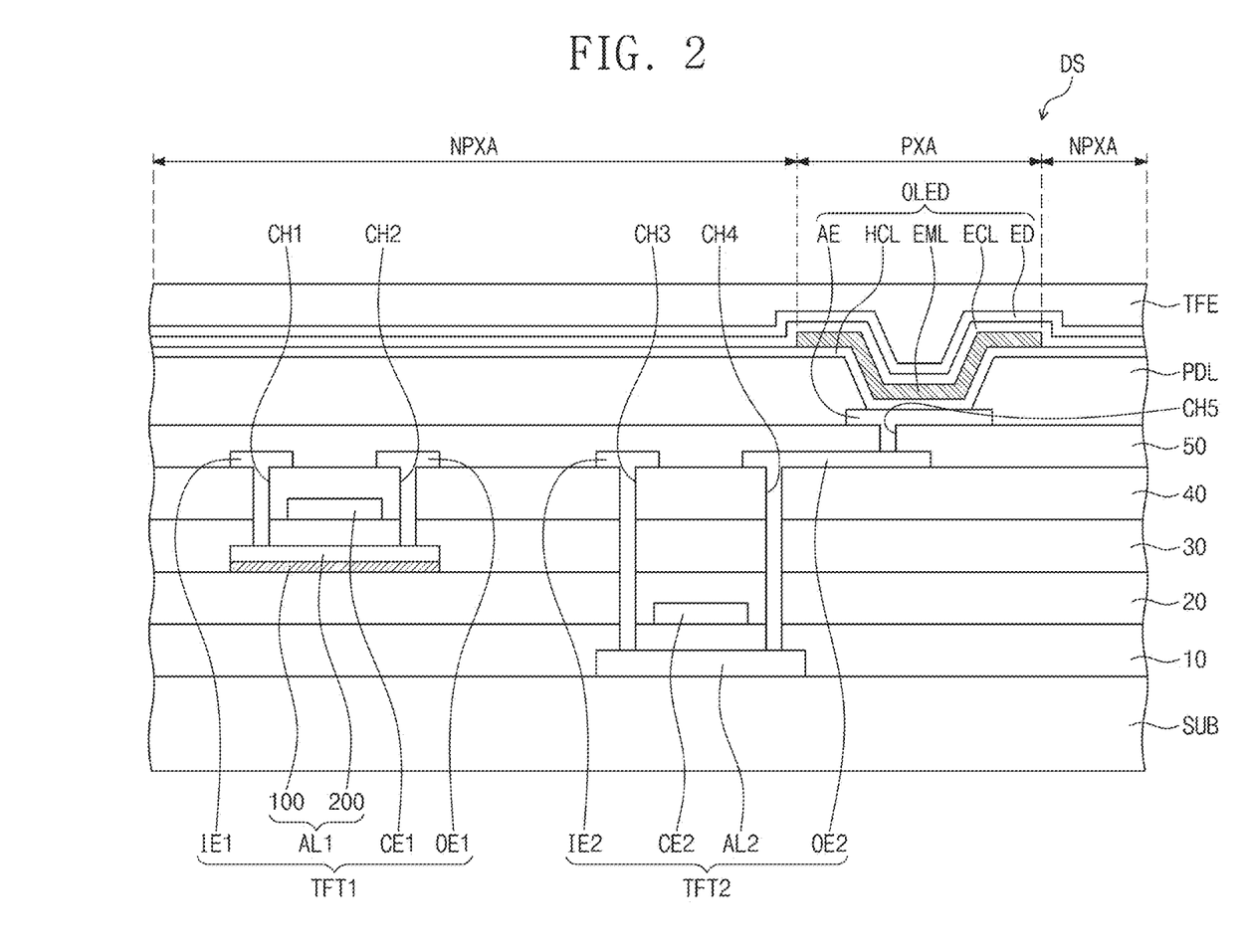
FIG. 2 is a cross-sectional view illustrating a portion of the display apparatus according to an embodiment of the inventive concept.

FIG. 1 is a block diagram of a display apparatus according to an embodiment of the inventive concept. FIG. 2 is a cross-sectional view illustrating a portion of the display apparatus according to an embodiment of the inventive concept. Hereinafter, a display apparatus will be described with reference to FIGS. 1 and 2.

A display apparatus DS includes at least one transistor. FIG. 1 illustrates the display apparatus DS according to an embodiment of the inventive concept. Hereinafter, although the display apparatus DS is exemplified, the display apparatus DS according to an embodiment of the inventive concept may be realized according to various embodiments and also may not be limited to a specific embodiment.

The display apparatus DS may include a timing control unit TC, a scan driving circuit SDC, a data driving circuit DDC, and a display panel DP.

The timing control unit TC converts data format of input image signals to match an interface specification with the scan driving circuit SDC to generate image data D-RGB. Also, the timing control unit TC outputs various control signals DCS and SCS.

The scan driving circuit SDC receives a scan control signal SCS from the timing control unit TC. The scan control signal SCS may include a vertical start signal for starting an operation of the scan driving circuit SDC and a clock signal for determining an output timing of the signals.

The scan driving circuit SDC generates a plurality of scan signals, and the plurality of scan signals are successively outputted to a plurality of scan lines SL1 to SLn. Although not shown, the scan driving circuit SDC generates a plurality of emission control signals in response to the scan control signal SCS to output emission control signals to a plurality of emission lines.

The data driving circuit DDC receives the data control signal DCS and the image data D-RGB from the timing control unit TC. The data driving circuit DDC converts the image data D-RGB into data signals to output the data signals to data lines DL1 to DLm. The data signals are analog voltages corresponding to gray values of the image data D-RGB.

The display panel DP includes the scan lines SL1 to SLn, the data line DL1 to DLm, and the plurality of pixels PX. For convenience of description, the plurality of pixels PX are indicated by a dotted line in one area.

The scan lines SL1 to SLn extend in a first direction DR1 and are arranged in a second direction DR2 perpendicular to the first direction DR1. The data lines DL1 to DLm are installed from the scan lines SL1 to SLn and cross the gate lines SL1 to SLn.

The plurality of pixels PX are connected to corresponding scan lines of the scan lines SL1 to SLn and corresponding data lines of the data lines DL1 to DLm. Although not shown, the plurality of pixels PX may be connected to corresponding emission lines of the emission lines.

A signal diagram will be described in detail using one pixel PX11 of the plurality of pixels PX. Constituents provided in the pixel PX11 may be equally applied to the plurality of pixels, and thus, duplicated description will be omitted.

The pixel PX11 includes a first transistor TFT1, a second transistor TFT2, a capacitor Cap, and an organic light emitting diode OLED.

The pixel PX11 receives a scan signal from the first scan line SL1 and also receives a data signal from the first data line DL1. Also, the pixel PX11 receives a first power voltage ELVDD from a power line PL.

The first transistor TFT1 includes a first input electrode IE1, a first output electrode OE1, a first control electrode CE1, and a first semiconductor layer AL1. The first transistor TFT1 outputs a data signal applied to the first data line DL1 in response to a scan signal applied to the first scan line SL1. The first transistor TFT1 may be a control transistor for turning on-off the pixel PX.

The capacitor Cap charges a voltage corresponding to the data signal received from the first transistor TFT1.

The second transistor TFT2 includes a second input electrode IE2, a second output electrode OE2, a second control electrode CE2, and a second semiconductor layer AL2. The second transistor TFT2 may be disposed on a base substrate SUB. The second transistor TFT2 is connected to the organic light emitting diode OLED. The second transistor TFT2 may control driving current flowing through the organic light emitting diode OLED to correspond to a charge amount stored in the capacitor Cap.

The organic light emitting diode OLED includes an anode electrode AE connected to the second transistor TFT2 and a cathode electrode receiving a second power voltage ELVSS. The second power voltage ELVSS may have a level less than that of the first power voltage ELVDD. Also, the organic light emitting diode OLED includes an organic emission layer EML disposed between at least the anode electrode AE and the cathode electrode ED. The organic light emitting diode OLED emits light during the turn-on period of the second transistor TFT2.

The constituents of the plurality of pixels PX may be realized according to various embodiments, and also may not be limited to a specific embodiment.

The display apparatus DS includes the base substrate SUB, the first transistor TFT1, the second transistor TFT2, a pixel define layer PDL, the organic light emitting diode OLED, and a thin film encapsulation layer TFE. Also, although not shown, the display apparatus DS may include the capacitor Cap (see FIG. 1).

The base substrate SUB has a top surface that is defined by the first direction DR1 (see FIG. 1) and the second direction DR2 (see FIG. 1). The base substrate SUB may be a base layer on which a plurality of electrodes, insulation layers, and semiconductor layers are disposed. The base substrate SUB may include a plastic substrate, a glass substrate, a metal substrate, and the like.

Although not shown, a buffer layer for improving coupling force between the base substrate SUB and conductive patterns and semiconductor patterns may be disposed on the base substrate SUB. The buffer layer may be selectively disposed or omitted.

The first transistor TFT1 and the second transistor TFT2 may be disposed on the base substrate SUB.

The second semiconductor layer AL2 may be disposed on the base substrate SUB. The second semiconductor layer AL2 may be connected to the second input electrode IE2 and the second output electrode OE2. The second semiconductor layer AL2 may overlap the second control electrode CE2. The second semiconductor layer AL2 may include a polycrystalline semiconductor material. For example, the second semiconductor layer may include polysilicon (poly-Si).

A first insulation layer 10 may be disposed on the base substrate SUB. The first insulation layer 10 may cover the second semiconductor layer AL2. The first insulation layer 10 may include at least one of an inorganic material and/or an organic material. For example, the first insulation layer 10 may include silicon nitride and/or silicon oxide.

The second control electrode CE2 may be disposed on the first insulation layer 10. The second control electrode CE2 may be disposed to overlap the second semiconductor layer AL2.

A second insulation layer 20 may be disposed on the first insulation layer 10. The second insulation layer 20 may cover the second control electrode CE2. The second insulation layer 20 may include the same material as the first insulation layer 10.

The first semiconductor layer AL1 may be disposed on the second insulation layer 20. The first semiconductor layer AL1 may include a first layer 100 and a second layer 200. The first semiconductor layer AL1 may be connected to the first input electrode IE1 and the first output electrode OE1.

The first layer 100 may be a base layer, on which crystals of the second layer 200 are grown, as a seed layer for controlling the crystals of the second layer 200. The first layer 100 may be made of at least two materials of Group IV elements.

The second layer 200 is disposed to come into contact with the first layer 100. The crystals of the second layer 200 may be grown by the first layer 100. The grown crystals of the second layer 200 may be made of the same material as the at least two materials of the Group VI elements and also be a crystallized compound. For example, the compound may be made of at least two material of silicon (Si), germanium (Ge), and carbon (C).

A third insulation layer 30 may be disposed on the second insulation layer 20. The third insulation layer 30 may cover the first semiconductor layer AL1. The third insulation layer 30 may include the same material as the first insulation layer 10.

The first control electrode CE1 may be disposed on the third insulation layer 30. The first control electrode CE1 may be disposed to overlap the first semiconductor layer AL1.

A fourth insulation layer 40 may be disposed on the third insulation layer 30. The fourth insulation layer 40 may cover the first control electrode CE2. The fourth insulation layer 40 may include the same material as the first insulation layer 10.

The input electrodes and the output electrodes of each of the first transistor TFT1 and the second transistor TFT2 may be disposed on the fourth insulation layer 40. The first input electrode IE1 and the first output electrode OE1 of the first transistor TFT1 and the second input electrode IE2 and the second output electrode OE2 of the second transistor TFT2 may come into contact with the first semiconductor layer AL1 and the second semiconductor layer AL2, respectively.

The input electrode and the output electrodes of each of the first transistor TFT1 and the second transistor TFT2 may come into contact with the semiconductor layers through contact holes defined by the insulation layers, respectively.

For example, a first contact hole CH1 and a second contact hole CH2 may pass through the third insulation layer 30 and the fourth insulation layer 40.

The first input electrode IE1 and the first output electrode OE1 may be connected to the first semiconductor layer AL1 through the first contact hole CH1 and the second contact hole CH2, respectively.

For example, a third contact hole CH3 and a fourth contact hole CH4 may pass through the first insulation layer 10, the second insulation layer 20, the third insulation layer 30, and the fourth insulation layer 40.

The second input electrode IE2 and the second output electrode OE2 may be connected to the second semiconductor layer AL2 though the third contact hole CH3 and the fourth contact hole CH4, respectively.

A fifth insulation layer 50 may be disposed on the fourth insulation layer 40. The fifth insulation layer 50 may cover the input electrodes and the output electrodes of each of the first transistor TFT1 and the second transistor TFT2. The pixel define layer PDL and the organic light emitting diode OLED may be disposed on the fifth insulation layer 50. The anode electrode AE may be disposed on the fifth insulation layer 50. The fifth insulation layer 50 may include the same material as the first insulation layer 10.

The anode electrode AE may be connected to the second output electrode OE2 through a fifth contact hole CH5 passing through the fifth insulation layer 50.

An opening OP may be defined in the pixel define layer PDL. The opening OP of the pixel define layer PDL may expose at least a portion of the anode electrode AE.

The plurality of pixels PX may be disposed on a pixel area on a plane of the display panel DP. The pixel area may include an emission area PXA and a non-emission area NPXA that is adjacent to the emission area PXA. The non-emission area NPXA may have a shape surrounding the emission area PXA. In the current embodiment, the emission area PXA is defined to correspond to the anode electrode AE. However, the embodiment of the inventive concept is not limited to the above-described emission area PXA. That is, the emission area PXA may be any area as long as light is emitted from the area. The emission area PXA may be defined to correspond to a portion of the anode electrode AE, which is exposed by the opening OP.

A hole control layer HCL may be disposed on the pixel define layer PDL. The hole control layer HCL may include at least one of a hole injection layer, a hole transport layer, or a single layer having a hole injection function and a hole transport function. The hole control layer HCL may control movement of holes. A hole control layer HCL may be commonly disposed on the emission area PXA and the non-emission area NPXA. Although not particularly shown, a common layer such as the hole control layer HCL may be commonly disposed on the plurality of pixels PX.

The organic emission layer EML may be disposed on the hole control layer HCL. The organic emission layer EML may be disposed on only an area corresponding to the opening OP. That is, the organic emission layer EML may be formed to be separated from each of the plurality of pixels PX.

An electron control layer ECL may be disposed on the organic emission layer EML. The electron control layer ECL may be an electron transport layer including an electron transport material or an electron injection/transport signal layer including an electron transport material and an electron injection material.

The cathode electrode ED may be disposed on the electron control layer ECL. The plurality of pixels PX may be commonly disposed on the cathode electrode ED. The cathode electrode ED may receive a voltage opposite to the anode electrode AE. The cathode electrode ED may be made of a material having a low work function so that electrons are easily injected.

The thin film encapsulation layer TFE may be disposed on the cathode electrode ED. The thin film encapsulation layer TFE is commonly disposed on the plurality of pixels PX. The thin film encapsulation layer TFE covers an entire surface of the cathode electrode ED to seal the organic light emitting diode OLED.

The thin film encapsulation layer TFE may include a plurality of inorganic layers. Each of the inorganic layers may include at least one of silicon nitride or silicon oxide.

Although not shown, a capping layer covering the cathode electrode ED may be further disposed. Here, the thin film encapsulation layer TFE may directly cover the capping layer.

According to the current embodiment, the first transistor TFT1 and the second transistor TFT2 may be disposed on layers different from each other. Thus, the transistors may not affect each other during the process.

Figure 3:
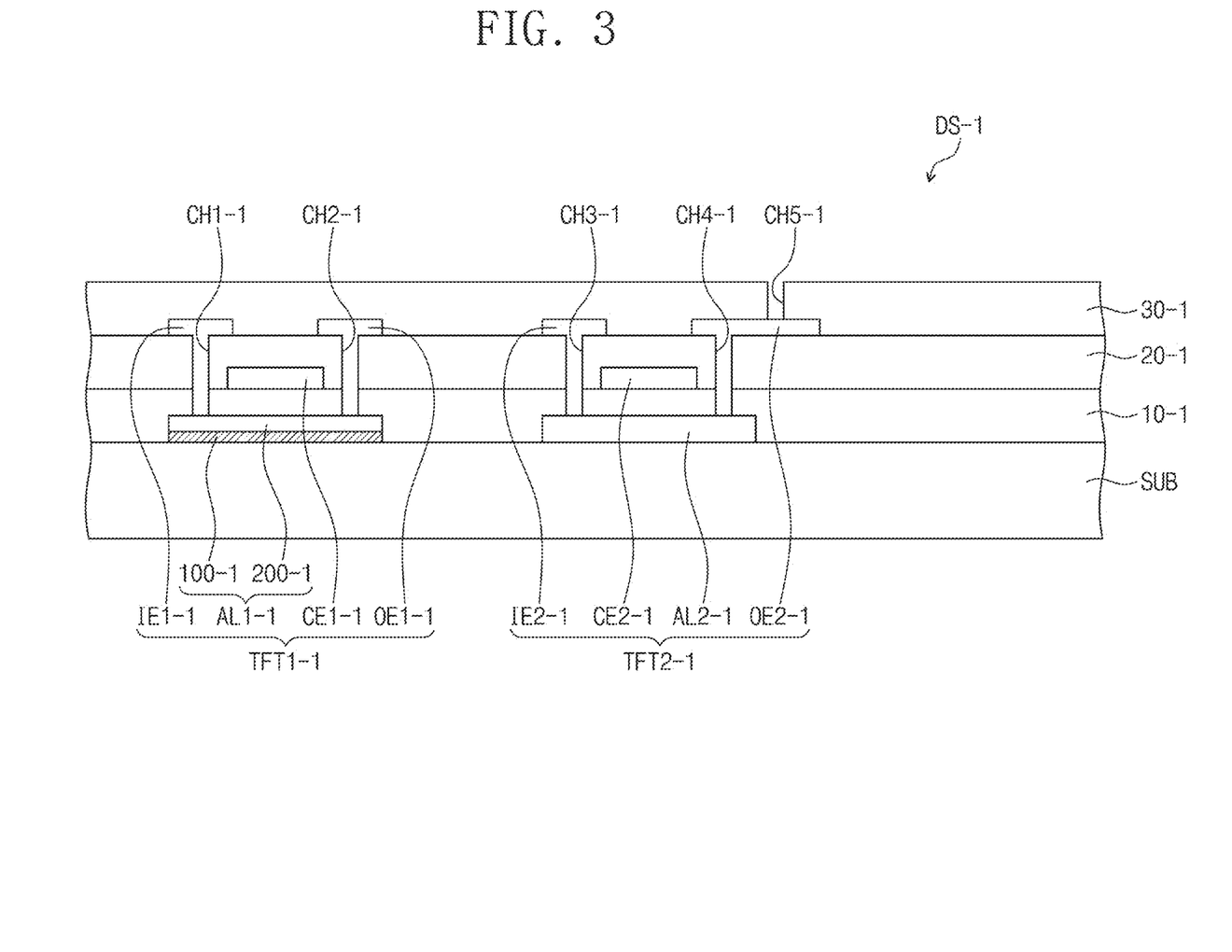
FIG. 3 is a cross-sectional view illustrating a portion of the display apparatus according to an embodiment of the inventive concept.

FIG. 3 is a cross-sectional view illustrating a portion of the display apparatus according to an embodiment of the inventive concept. In FIG. 3, for convenience of description, the organic light emitting diode OLED (see FIG. 2) and the thin film encapsulation layer TFE of FIG. 2 will be omitted. Hereinafter, constituents corresponding to those of FIG. 2 may be denoted by similar reference numerals, and their duplicated descriptions will be omitted.

A first semiconductor layer AL1-1 and a second semiconductor layer AL2-1 may be disposed on a base substrate SUB-1.

A first insulation layer 10-1 may be disposed on the base substrate SUB-1. The first insulation layer 10-1 may cover the first semiconductor layer AL1-1 and the second semiconductor layer AL2-1.

The first semiconductor layer AL1-1 may include a first layer 100-1 and a second layer 200-1.

The first layer 100-1 of the first semiconductor layer AL1-1 may be made of a material corresponding to that of the above-described first layer 100 (see FIG. 2), and the second layer 200-1 may be made of a material corresponding to that of the above-described second layer 200. Thus, the first layer 100-1 may be a base layer, on which crystals of the second layer 200-1 are grown, as a seed layer for controlling the crystals of the second layer 200-1.

The second semiconductor layer AL2-1 may include a polycrystalline semiconductor material.

A first control electrode CE1-1 and a second control electrode CE2-1 may be disposed on the first insulation layer 10-1. The first control electrode CE1-1 and the second control electrode CE2-1 may be disposed to overlap the first semiconductor layer AL1-1 and the second semiconductor layer AL2-1, respectively.

A second insulation layer 20-1 may be disposed on the first insulation layer 10-1. The second insulation layer 20-1 may cover the first control electrode CE1-1 and the second control electrode CE2-1.

Input electrodes and output electrodes of each of a first transistor TFT1-1 and a second transistor TFT2-1 may be disposed on the second insulation layer 20-1. A first input electrode IE1-1 and a first output electrode OE1-1 of the first transistor TFT1-1 and a second input electrode IE2-1 and a second output electrode OE2-1 of the second transistor TFT2-1 may come into contact with the first semiconductor layer AL1-1 and the second semiconductor layer AL2-1, respectively.

For example, a first contact hole CH1-1, a second contact hole CH2-1, a third contact hole CH3-1, and a fourth contact hole CH4-1 may pass through the first insulation layer 10-1 and the second insulation layer 20-1.

The first input electrode IE1-1 and the first output electrode OE1-1 may be connected to the first semiconductor layer AL1-1 through the first contact hole CH1-1 and the second contact hole CH2-1, respectively. The second input electrode IE2-1 and the second output electrode OE2-1 may be connected to the second semiconductor layer AL2-1 though the third contact hole CH3-1 and the fourth contact hole CH4-1, respectively.

A third insulation layer 30-1 may be disposed on the second insulation layer 20-1. The third insulation layer 30-1 may cover the input electrodes and the output electrodes of each of the first transistor TFT1-1 and the second transistor TFT2-1. A fifth contact hole CH5-1 may be defined in the third insulation layer 30-1. The second output electrode OE2-1 and the organic light emitting diode OLED (see FIG. 2) disposed on layers different from each other may be connected to each other through the fifth contact hole CH5-1.

According to the current embodiment, the first transistor TFT1-1 and the second transistor TFT2-1 may be disposed on the same layer. The transistors may be disposed on the same layer to reduce a thickness of the display apparatus DS. Also, the electrodes constituting each of the transistors may be formed through one mask to reduce a process time and process costs.

Although not particularly shown, the insulation layers of the first transistor TFT-1 and the second transistor TFT2-1 according to an embodiment of the inventive concept may be changed in lamination structure.

Figure 4A:
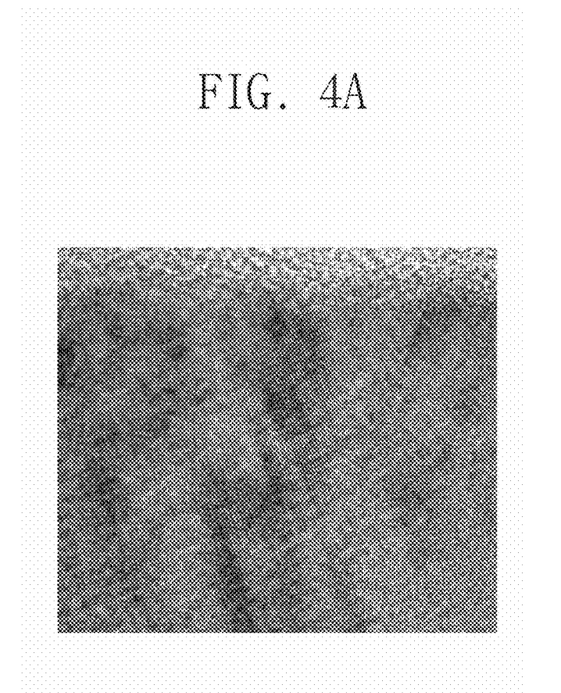
FIGS. 4A and 4B are transmission electron microscope photographs illustrating a crystal structure of a semiconductor layer according to an embodiment of the inventive concept.
Figure 4B:
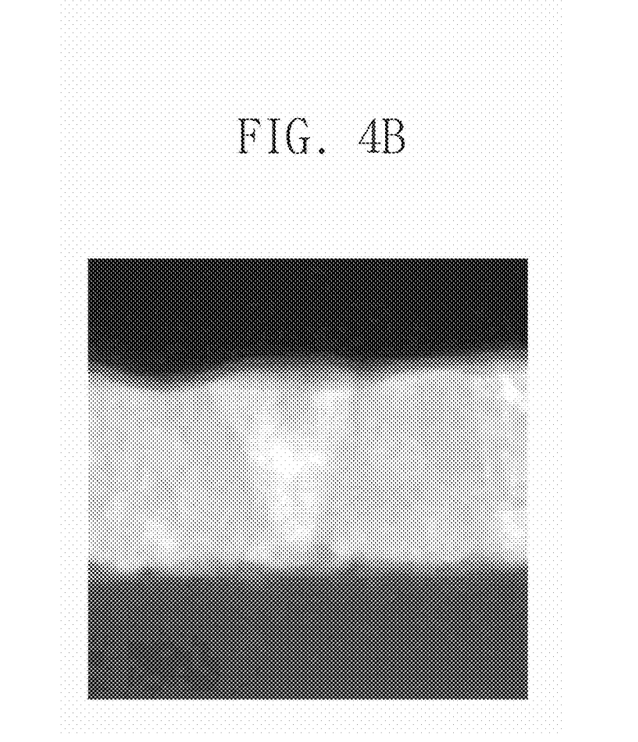

FIGS. 4A and 4B are transmission electron microscope photographs illustrating a crystal structure of the semiconductor layer according to an embodiment of the inventive concept.

The photographs of FIGS. 4A and 4B illustrate experimental examples of the crystal structure of the first semiconductor layer AL1 (see FIG. 2) corresponding to the first transistor TFT1 (see FIG. 1).

The photograph of FIG. 4A illustrates crystals grown by the seed layer that is the first layer 100 (see FIG. 2) when a ratio of silicon (Si):germanium (Ge) is about 27:75.

The photograph of FIG. 4B illustrates crystals grown by the seed layer that is the first layer 100 (see FIG. 2) when a ratio of silicon (Si):germanium (Ge) is about 50:50.

Table 1 below is for Embodiments 1 to 3. In detail, Table 1 shows experimental values in states of each of compounds forming the crystals when ratios of masses (%) of silicon (Si):germanium (Ge) are about 25:75 (Embodiment 1), about 50:50 (Embodiment 2), and about 75:25 (Embodiment 3). Each of the embodiments represents an intrinsic carrier density, a melding point, and mobility of electrons and holes, which are measured under the same temperature and pressure.

TABLE 1

| Item | Embodiment 1 | Embodiment 2 | Embodiment 3 |
|---|---|---|---|
| Intrinsic Carrier Density (eV) | $1.8 \times 10^{13}$ | $1.2 \times 10^{13}$ | $0.6 \times 10^{13}$ |
| Melting Point (° C.) | 1056.5 | 1176 | 1295.5 |
| Mobility ($cm^2/V_{-S}$) | $3300_{(electron)}$ $1537.5_{(hole)}$ | $7700_{(electron)}$ $1175_{(hole)}$ | $2100_{(electron)}$ $812.5_{(hole)}$ |

Referring to Table 1, as a rate of the mass (%) of germanium (Ge) gradually increases, experimental values, in which melting points are gradually lowered from Embodiment 3 to Embodiment 1, are shown. In case of a low melting point, a temperature for the crystallization may be reduced. As a result, since the process is performed at a low temperature, damage of other factors constituting the transistor due to heat may be reduced.

As described above, the first semiconductor layer AL1 (see FIG. 2) constitutes the first transistor TFT1 (see FIG. 1) controlling the turn on-off of the pixel PX (see FIG. 1). Thus, the charge mobility of the first semiconductor layer AL1 servers as an important index for evaluating the performance of the transistor. The more the charge mobility is high, the more efficient current application may be possible, and a degree of integration of the device may increase. The charge mobility may increase as the crystal size of the first semiconductor layer AL1 (see FIG. 2) is larger. Also, the more the size of the crystal is small, the more the charge mobility is low. When a ratio of masses (%) of silicon (Si):germanium (Ge) is about 50:50, the electron mobility is about 7700 (cm2/V-S) and thus is the most excellent.

According to one example of the experimental examples, a compound having crystals may be formed by using at least two materials of Group IV elements having physical and chemical properties similar to those of silicon (Si): germanium (Ge) to form the semiconductor layer having the high charge mobility like the experimental examples.

When the compound having the crystals is used as the semiconductor layer of the control transistor, a display apparatus which has high field-effect mobility, is applicable to a high-speed operation circuit, and is improved in performance, may be provided.

FIGS. 5A to 5H are cross-sectional views illustrating a method of manufacturing a display apparatus according to an embodiment of the inventive concept. Hereinafter, the manufacturing method will be described with reference to FIGS. 5A to 5H.

Figure 5A:
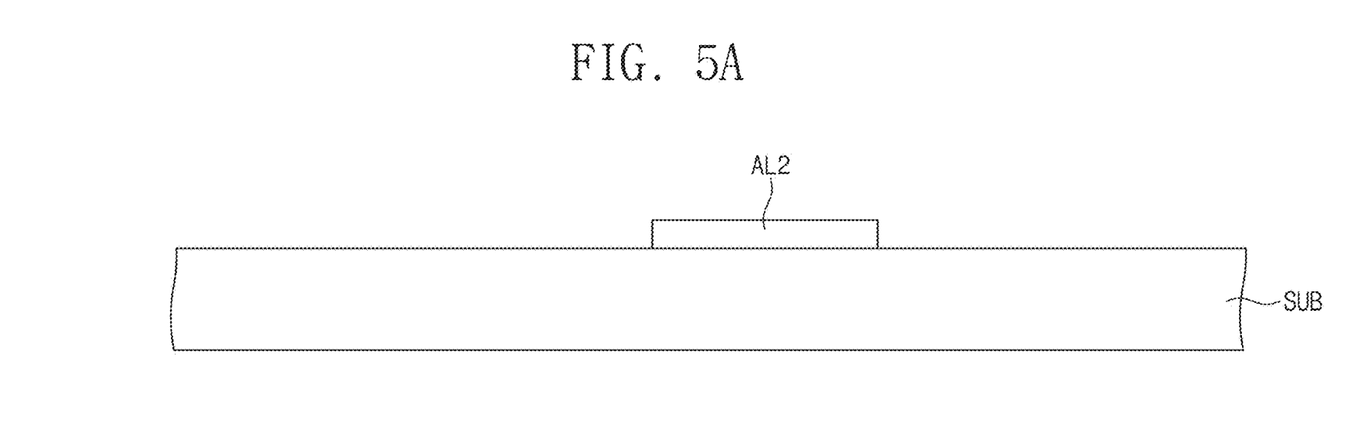
FIGS. 5A, 5B, 5C, 5D, 5E, 5F, 5G, and 5H are cross-sectional views illustrating a method of manufacturing a display apparatus according to an embodiment of the inventive concept.

Referring to FIG. 5A, a second semiconductor layer AL2 may be formed on a top surface of a base substrate SUB. Although not shown, the second semiconductor layer AL2 may be formed by depositing a crystalline semiconductor material on an entire surface of the base substrate SUB and then patterning the semiconductor material.

Figure 5B:
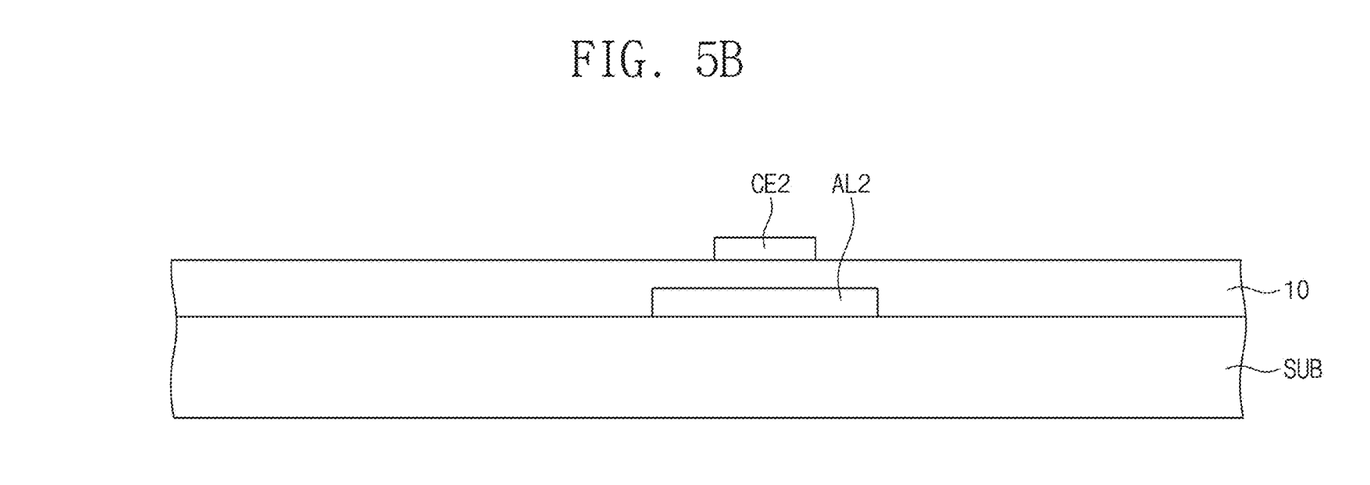

Thereafter, referring to FIG. 5B, a first insulation layer 10 may be formed on the base substrate SUB. The first insulation layer 10 may be formed by depositing, applying, or printing an inorganic material or an organic material. The first insulation layer 10 may cover the second semiconductor layer AL2.

Although not shown, the second control electrode CE2 may be formed by depositing a conductive material on an entire surface of the second insulation layer 20 and then patterning the conductive material. A second control electrode CE2 may overlap the second semiconductor layer AL2 and be formed on the first insulation layer 10.

Figure 5C:
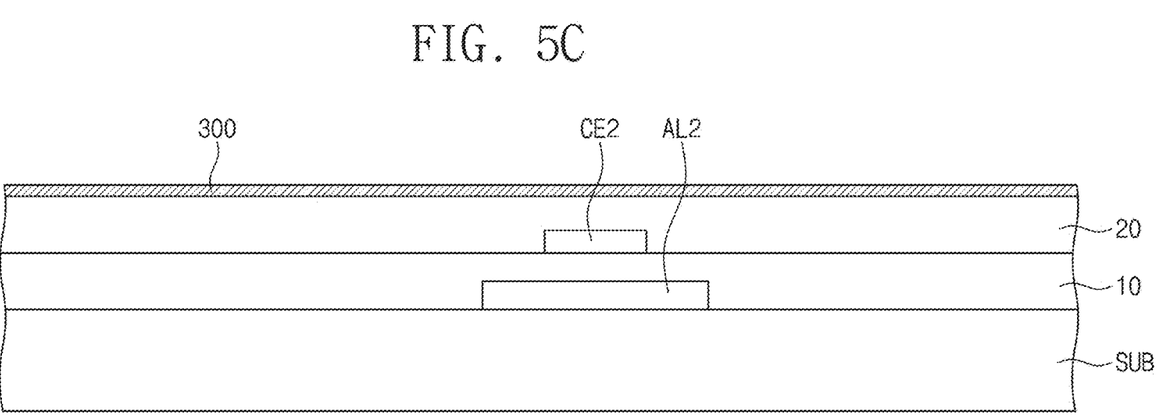

Thereafter, referring to FIG. 5C, a second insulation layer 20 may be formed on the first insulation layer 10. The second insulation layer 20 may be formed by depositing, applying, or printing an inorganic material or an organic material.

A seed layer 300 may be formed on the second insulation layer 20. The seed layer 300 may be formed by depositing a seed material on the second insulation layer 20. Here, the seed layer 300 may have a predetermined crystalline structure. The deposition process of the seed material may be performed through a physical vapor deposition process (PVD) or a chemical vapor deposition process (CVD). The seed layer 300 may cover the second insulation layer 20. Since the seed layer 300 may have the predetermined crystalline structure, the seed layer 300 may be disposed on a lower portion of a layer on which crystals will be grown and thus serve as a base layer.

Figure 5D:
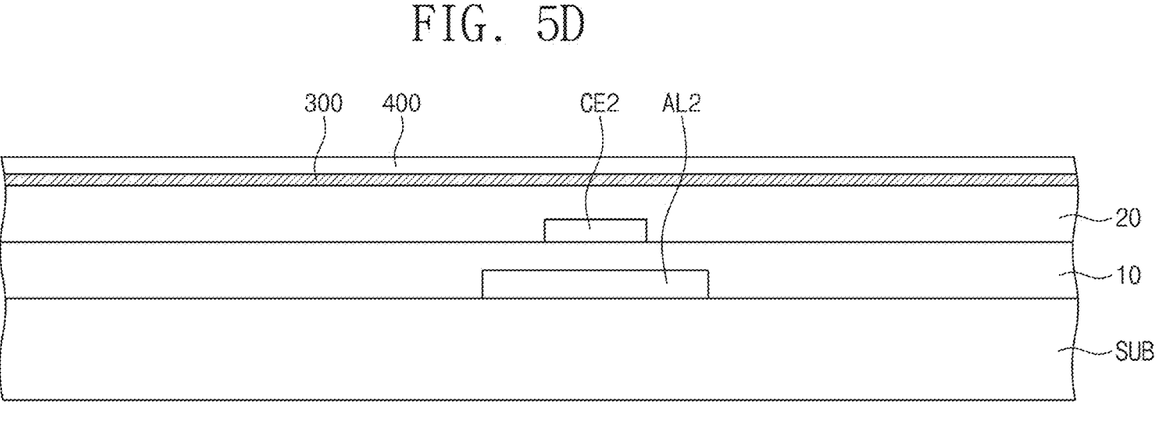

Thereafter, referring to FIG. 5D, a crystallization layer 400 may be formed on the seed layer 300. The crystallization layer 400 may be formed by depositing a semiconductor compound on the seed layer 300. The deposition process may include the PVD or the CVD. The semiconductor compound includes at least two materials of Group IV elements. For example, the semiconductor compound may include at least two materials of SI, Ge, and C.

The crystallization layer 400 may be deposited on the seed layer 300 and then grown along the crystalline structure of the seed layer 300. Thus, the crystallization layer 400 may have the same crystalline structure as the seed layer 300, and the seed layer may control the crystalline structure of the crystallization layer 400.

In the current embodiment, the seed material forming the seed layer 300 may include the same material as the crystallization layer 400. For example, the seed layer 300 may be formed by depositing a semiconductor compound including at least two materials of the Group IV elements. Here, the seed layer 300 and the crystallization layer 400 may be continuously formed within the same chamber. In the method for manufacturing the display panel according to an embodiment of the inventive concept, the crystallization layer 400 having a multilayered structure may be formed without additionally performing a crystallization process. Also, the method for manufacturing the display panel according to an embodiment of the inventive concept may include a process of forming the seed layer 300 to easily control the crystalline structure of the crystallization layer 400.

Figure 5E:
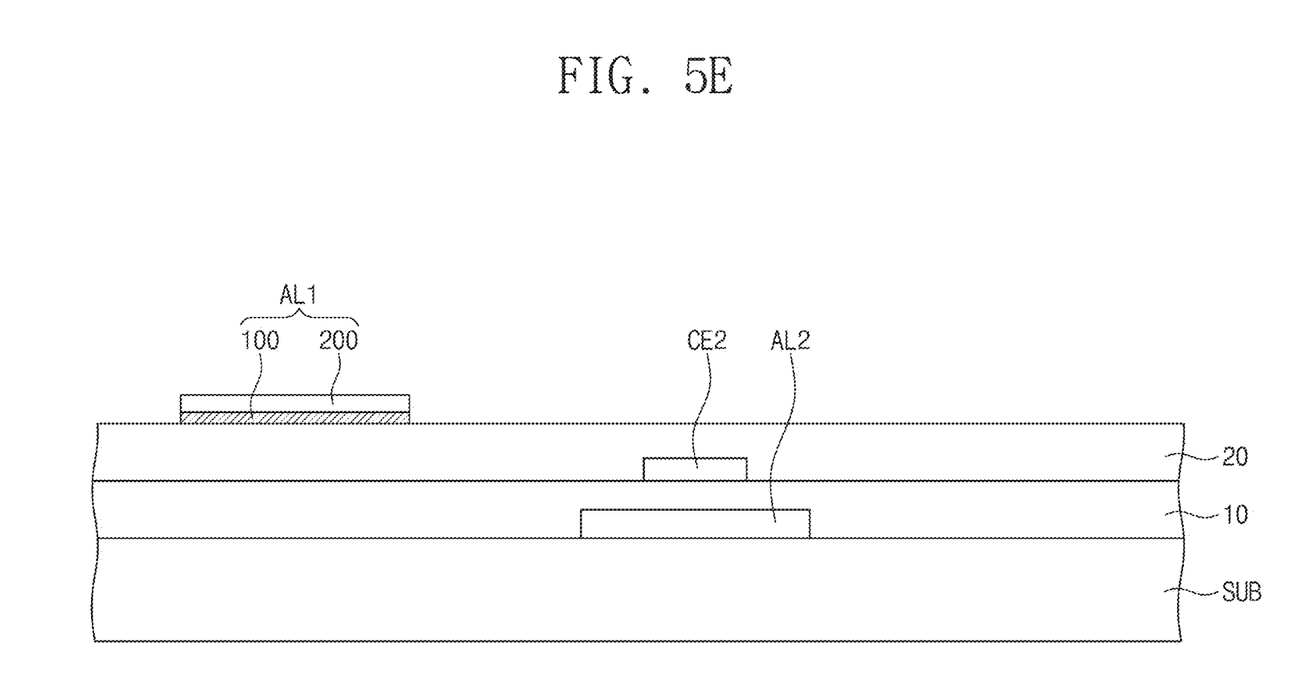

Thereafter, referring to FIG. 5E, the seed layer 300 and the crystallization layer 400 may be patterned to form the first semiconductor layer AL1. The first semiconductor layer AL1 may be formed by patterning the seed layer 300 and the crystallization layer 400 at the same time by using one mask. Thus, the first semiconductor layer Al1 may include a first layer 100 and a second layer 200, which have the same shape.

Figure 5F:
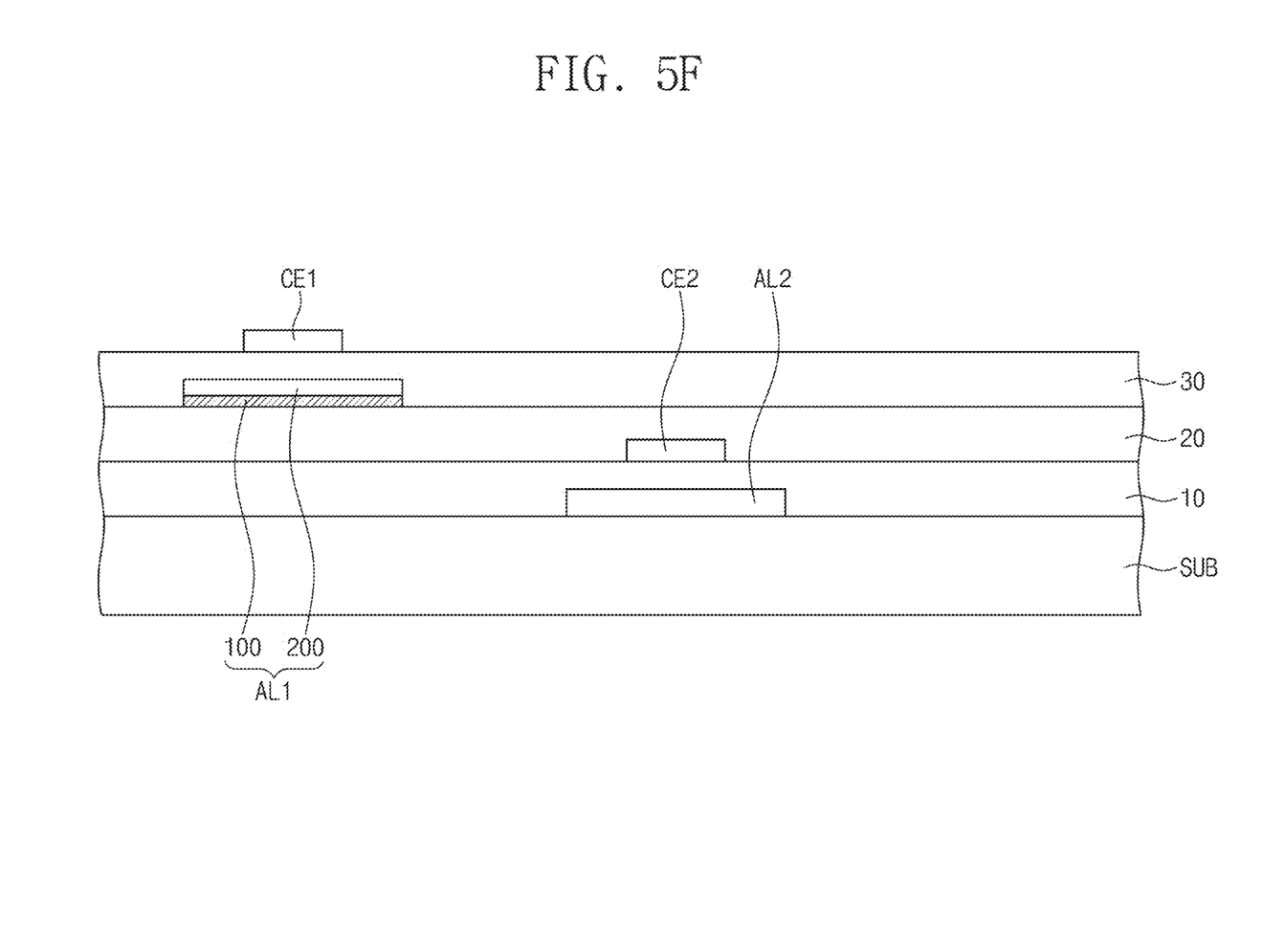

Thereafter, referring to FIG. 5F, a third insulation layer 30 may be formed on the second insulation layer 20. The third insulation layer 30 may be formed by depositing, applying, or printing an inorganic material or an organic material.

A first control electrode CE1 may be formed on the third insulation layer 30. Although not shown, the first control electrode CE1 may be formed by depositing a conductive material on an entire surface of the third insulation layer 30 and then patterning the conductive material. The first control electrode CE1 may be formed to overlap the first semiconductor layer AL1.

Figure 5G:
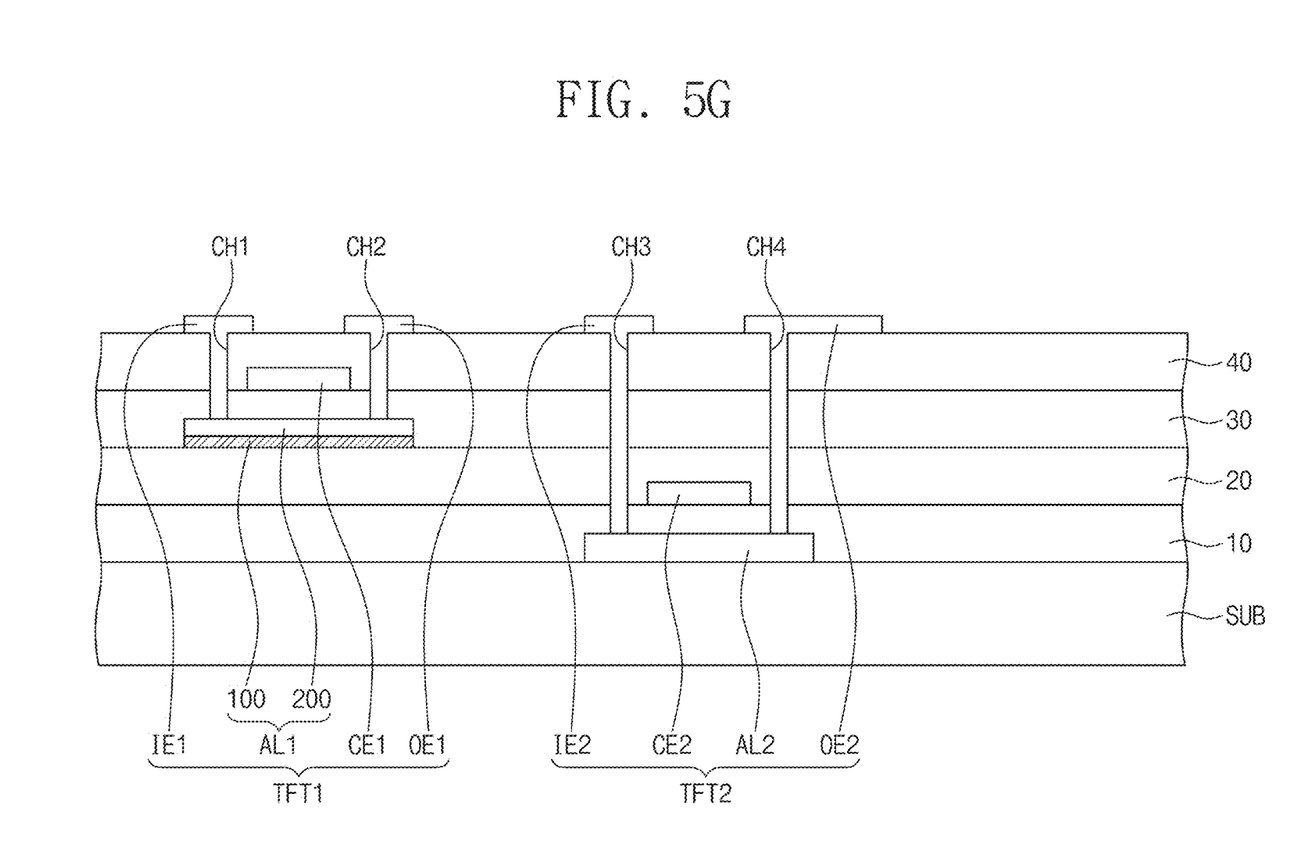

Thereafter, referring to FIG. 5G, a fourth insulation layer 40 may be formed on the third insulation layer 30. The fourth insulation layer 40 may be formed by depositing, applying, or printing an inorganic material or an organic material. Input electrodes and output electrodes of each of the first transistor TFT1 and the second transistor TFT2 may be formed on the fourth insulation layer 40. Although the input electrodes and the output electrodes are not shown, the input electrodes and the output electrodes may be formed by depositing and patterning the conductive material.

Each of the input electrodes and the output electrodes may be connected to the corresponding semiconductor layer. The first insulation layer 10 and the second insulation layer 20 may be etched to form a first contact hole CH1 and a second contact hole CH2. Thus, a first input electrode IE1 and a first output electrode OE1 may be connected to the first semiconductor layer AL1 through the corresponding contact holes, respectively. Also, the first insulation layer 10, the second insulation layer 20, the third insulation layer 30, and the fourth insulation layer 40 may be etched to form a third contact hole CH3 and a fourth contact hole CH4. Thus, a second input electrode IE2 and a second output electrode OE2 may be connected to the second semiconductor layer AL2 through the corresponding contact holes, respectively.

Figure 5H:
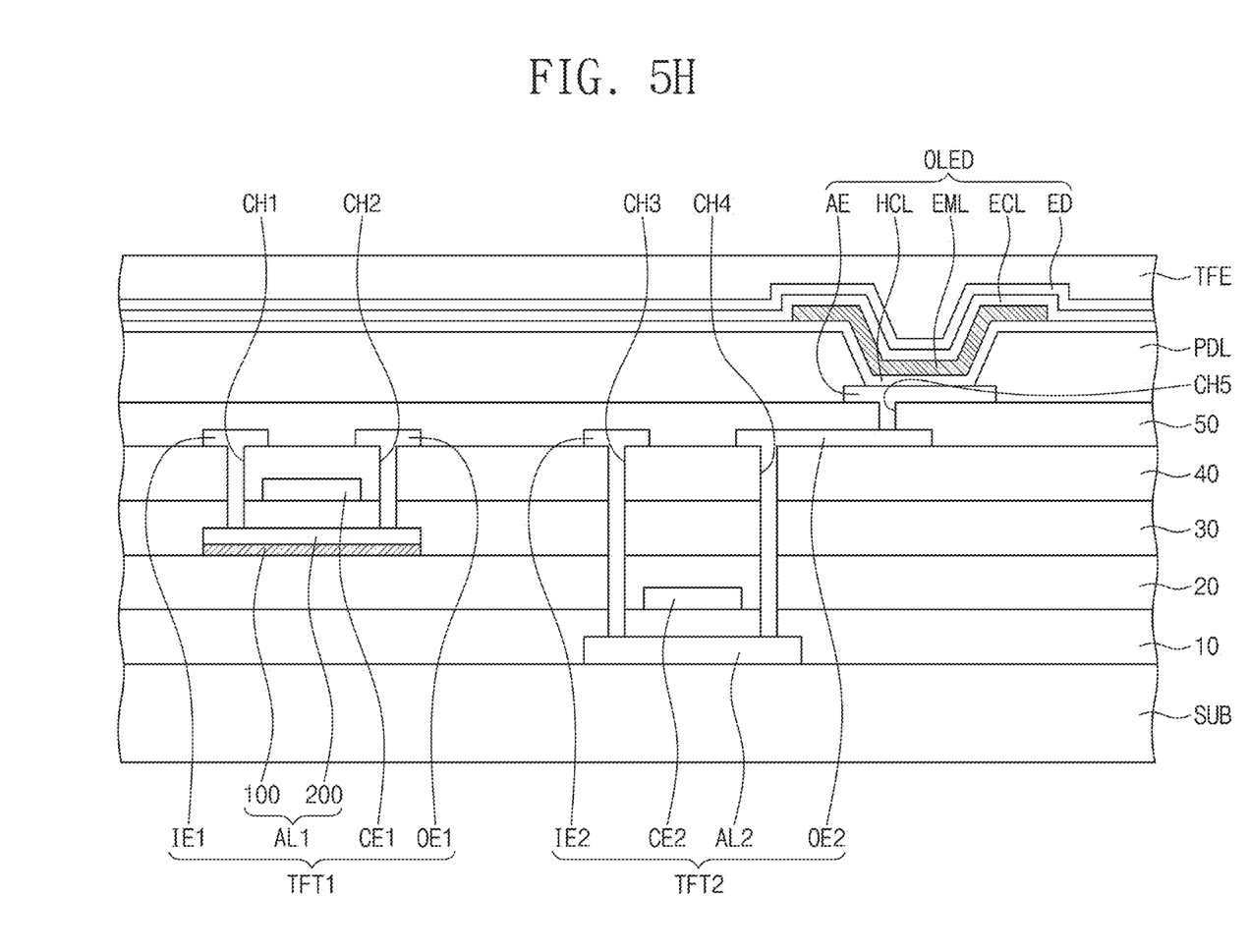

Thereafter, referring to FIG. 5H, a fifth insulation layer 50 may be formed on the fourth insulation layer 40. The fifth insulation layer 50 may be formed by depositing, applying, or printing an inorganic material or an organic material.

The fifth contact hole CH5 may be formed by removing a portion of the fifth insulation layer 50 through an etching process.

An anode electrode AE may be formed on the fifth insulation layer 50. The anode electrode AE may be formed by depositing a conductive material on the fifth insulation layer 50 and then patterning the conductive material. The anode electrode AE may be connected to the second output electrode OE2 through the fifth contact hole CH5.

Thereafter, a pixel define layer PDL may be formed on the fifth insulation layer 50. The pixel define layer PDL may be formed by depositing, applying, or printing an inorganic material and/or an organic material. A portion of the pixel define layer PDL may be removed to form a predetermined opening OP. The opening OP may expose at least a portion of the anode electrode AE. A hole control layer HCL, an emission layer EML, an electron control layer ECL, and a cathode electrode ED may be successively formed on the pixel define layer PDL. The anode electrode AE, the hole control layer HCL, the emission layer EML, the electron control layer ECL, the cathode electrode ED may constitute an organic light emitting diode OLED. Each of the hole control layer HCL, the emission layer EML, and the electron control layer ECL may be formed through a single process or a plurality of processes.

A thin film encapsulation layer TFE may be formed on the cathode electrode ED. The thin film encapsulation layer TFE may be formed by alternately depositing at least one inorganic layer and at least one organic layer.

As described above, since the first semiconductor layer AL1 and the second semiconductor layer AL2 are formed on layers different from each other, damage due to foreign substances or heat, which occurs during the process, may be reduced to provide the display apparatus having the improved reliability.

The present disclosure may provide the display apparatus which corresponds to the large area of the display panel and includes the multilayered transistor having the improved performance such as the improvement of the process yield.

It will be apparent to those skilled in the art that various modifications and variations can be made in the inventive concept. Thus, it is intended that the present disclosure covers the modifications and variations of this invention provided they come within the scope of the appended claims and their equivalents.

Hence, the real protective scope of the inventive concept shall be determined by the technical scope of the accompanying claims.

What is claimed is:

1. A display apparatus comprising:
   a base substrate;
   a first transistor disposed on the base substrate and comprising a first semiconductor layer, a first control electrode overlapping the first semiconductor layer, a first input electrode connected to the first semiconductor layer, and a first output electrode connected to the first semiconductor layer, the first semiconductor layer comprising a first layer and a second layer disposed to come into contact with a first layer and comprising a compound made of at least two materials of a Group IV elements;
   a second transistor disposed on the base substrate and comprising a second semiconductor layer spaced apart from the first semiconductor layer, a second control electrode overlapping the second semiconductor layer, a second input electrode connected to the second semiconductor layer, and a second output electrode connected to the second semiconductor layer; and
   an organic light emitting diode comprising a first electrode electrically connected the first transistor and the second transistor, a second electrode disposed on the first electrode, and an emission layer disposed between the first electrode and the second electrode.

2. The display apparatus of claim 1, wherein the first layer has a predetermined crystal, and
   at least a portion of the second layer has the same crystal as the first layer.

3. The display apparatus of claim 2, wherein the compound comprises at least two materials of Si, Ge, and C.

4. The display apparatus of claim 3, wherein the second semiconductor layer comprises polycrystalline silicon.

5. The display apparatus of claim 1, wherein the first semiconductor layer and the second semiconductor are disposed on the same layer.

6. The display apparatus of claim 1, further comprising at least one insulation layer disposed between the first semiconductor layer and the second semiconductor layer,
   wherein the first semiconductor layer is disposed on the insulation layer.

7. The display apparatus of claim 1, wherein the first electrode is connected to the second output electrode.

8. A display apparatus comprising:
   a base substrate;
   a first transistor disposed on the base substrate and comprising a first semiconductor layer, a first control electrode overlapping the first semiconductor layer, a first input electrode connected to the first semiconductor layer, and a first output electrode connected to the first semiconductor layer, the first semiconductor layer comprising a first layer and a second layer disposed to come into contact with a first layer and comprising a crystal made of at least two materials of a Group IV elements,
   a second transistor disposed on the base substrate and comprising a second semiconductor layer spaced apart from the first semiconductor layer, a second control electrode overlapping the second semiconductor layer, a second input electrode connected to the second semiconductor layer, and a second output electrode connected to the second semiconductor layer; and
   an organic light emitting diode electrically connected to the first transistor and the second transistor and comprising a first electrode, a second electrode disposed on the first electrode, and an emission layer disposed between the first electrode and the second electrode.

9. The display apparatus of claim 8, wherein the first layer has a predetermined crystal, and
   the crystal of the second layer is made of a compound.

10. The display apparatus of claim 9, wherein the second layer comprises the crystal made of at least two materials of Si, Ge, and C of Group IV elements.

* * * * *